(12) United States Patent
Koo et al.

(10) Patent No.: US 6,876,001 B2
(45) Date of Patent: Apr. 5, 2005

(54) FLAT PANEL DISPLAY WITH THIN FILM TRANSISTOR

(75) Inventors: Jae-Bon Koo, Yongin (KR); Ji-Yong Park, Suwon (KR); Ul-Ho Lee, Yongin (KR); Jin-Soo Kim, Yongin (KR); Jin-Woung Jung, Suwon (KR); Chang-Gyu Lee, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/715,424

(22) Filed: Nov. 19, 2003

(65) Prior Publication Data

US 2004/0195570 A1 Oct. 7, 2004

(30) Foreign Application Priority Data

Apr. 2, 2003 (KR) ................................ 10-2003-0020738

(51) Int. Cl.[7] .............................................. H01L 29/04
(52) U.S. Cl. .............................. 257/72; 257/59; 257/88
(58) Field of Search ........................ 257/59, 72, 88–93, 257/E29.151, E51.005, E29.273, E29.281, E29.299, E29.275, E29.277, E21.111, E29.117, E21.411

(56) References Cited

U.S. PATENT DOCUMENTS 5,534,716 A * 7/1996 Takemura .................... 257/72
5,808,321 A * 9/1998 Mitanaga et al. ............. 257/72
6,337,232 B1   1/2002 Kusumoto et al. .......... 438/151

FOREIGN PATENT DOCUMENTS

JP         2001-109399         4/2001     ............ G09F/9/30

* cited by examiner

Primary Examiner—Nathan J. Flynn
Assistant Examiner—Scott R Wilson
(74) Attorney, Agent, or Firm—McGuireWoods LLP (57) ABSTRACT

A flat panel display capable of lowering an on-current of a driving thin film transistor (TFT), maintaining high switching properties of a switching TFT, maintaining uniform brightness using the driving TFT, and maintaining a life span of a light emitting device while the same voltages are applied to the switching TFT and the driving TFT without changing a size of an active layer. The flat panel display includes a light emitting device, a switching thin film transistor including a semiconductor active layer having a channel area for transferring a data signal to the light emitting device, and a driving thin film transistor including a semiconductor active layer having a channel area for driving the light emitting device. A predetermined amount of current flows through the light emitting device according to the data signal. The channel area of the switching thin film transistor has crystal grains with at least one of different sized or different shaped crystal grains than the crystal grains in the channel area of the driving thin film transistor.

23 Claims, 10 Drawing Sheets

FLAT PANEL DISPLAY WITH THIN FILM TRANSISTOR

BACKGROUND OF THE INVENTION

This application claims the priority of Korean Patent Application No. 2003-20738, filed on Apr. 2, 2003, in the Korean Intellectual Property Office, the disclosure of which is incorporated herein in its entirety by reference.

1. Field of the Invention

The invention relates to an active matrix type flat panel display including a thin film transistor (TFT), and more particularly, to a flat panel display including a TFT having a polycrystalline silicon as an active layer, and different crystallization structures for the channel areas of the active layers of a switching TFT and a driving TFT.

2. Description of the Related Art

A thin film transistor (TFT) in a flat display device such as a liquid display device, an organic electroluminescence display device, or an inorganic electroluminescence display device is used as a switching device for controlling operations of pixels and as a driving device for driving the pixels.

The TFT includes a semiconductor active layer having a drain area and a source area which are doped with a high concentration of impurities and a channel area formed between the drain area and the source area, a gate insulating layer formed on the semiconductor active layer, and a gate electrode formed on the gate insulating layer which is located on an upper part of the channel area of the active layer. The semiconductor active layer can be classified as an amorphous silicon or a polycrystalline silicon according to the crystallized status of the silicon.

A TFT using amorphous silicon is advantageous in that a deposition can be performed at a low temperature, however, it is disadvantageous in that an electrical property and a reliability of the TFT are degraded. Also, it is difficult to make larger display devices. Thus, recently, polycrystalline silicon is being used. Polycrystalline silicon has a higher mobility of about tens to hundreds of $cm^2/V.s$, and low high frequency operation property and leakage current value. Thus, polycrystalline silicon is suitable for use in large-sized flat panel displays of high resolution.

A TFT is used as the switching device or the driving device of the pixel in the flat panel display, as described above. An organic electroluminescence display device of an active matrix type with an active driving method includes at least two TFTs per sub-pixel.

The organic electroluminescence device has an emission layer made of an organic material between an anode electrode and a cathode electrode. In the organic electroluminescence device, when a positive voltage and a negative voltage are respectively applied to the electrodes, holes injected from the anode electrode are moved to the emission layer through a hole transport layer, and electrons are injected into the emission layer through an electron transport layer from the cathode electrode. The holes and electrons are recombined on the emission layer to produce exitons. The exitons are changed from an excited status to a ground status, and accordingly, phosphor molecules in the emission layer are radiated to form an image. In case of a full-color electroluminescence display, pixels radiating red (R), green (G), and blue (B) colors are disposed as electroluminescence devices to realize the full colors.

In the active matrix type organic electroluminescence display device, a panel with high resolution is required, however, the above described TFT formed using the polycrystalline silicon of high function causes some problems in this case.

That is, in the active matrix type flat panel display device such as the active matrix type organic electroluminescence display device, the switching TFT and the driving TFT are made of the polycrystalline silicon. Thus, the switching TFT and the driving TFT have the same current mobility. Therefore, switching properties of the switching TFT and low current driving properties of the driving TFT cannot be satisfied simultaneously. That is, when the driving TFT and the switching TFT of a high resolution display device are fabricated using the polycrystalline silicon, which has a having larger current mobility, the high switching property of the switching TFT can be obtained, however, the brightness becomes too bright because an amount of current flowing toward an electroluminescence (EL) device through the driving TFT increases. Thus a current density per unit area of the device is increased while a life time of the EL device is decreased.

On the other hand, when the switching TFT and the driving TFT of the display device are fabricated using the amorphous silicon, which has a low current mobility, the TFTs should be fabricated in such way that the driving TFT uses a small current and the switching TFT uses a large current.

To solve the above problems, methods for restricting current flowing through the driving TFT are provided, such as, a method for increasing resistance of a channel area by reducing a ratio of a length to a width of the driving TFT (W/L) and a method for increasing resistance by forming a low doped area on the source/drain areas of the driving TFT.

However, in the method decreasing the W/L by increasing the length, a length of the channel area increases, thus forming stripes on the channel area and reducing an aperture area in a crystallization process in an excimer laser annealing (ELA) method. The method decreasing W/L by reducing the width is limited by a design rule of a photolithography process, and it is difficult to ensure a reliability of the TFT.

Also, the method for increasing the resistance by forming the low doped area requires an additional doping process.

A method for increasing TFT properties by reducing a thickness of the channel area is disclosed in U.S. Pat. No. 6,337,232.

The method for reducing a ratio of a length for a width of the driving TFT is disclosed in Japanese Patent Publication No. 2001-109399.

SUMMARY OF THE INVENTION

The invention provides a flat panel display in which an on-current of a driving thin film transistor (TFT) is lowered while keeping constant a driving voltage applied thereto, without changing a size of an active layer of the TFT.

The invention separately provides a flat panel display capable of maintaining high switching properties of a switching TFT, satisfying uniform brightness by a driving TFT, and maintaining a life span of a light emitting device.

According to an aspect of the invention, there is provided a flat panel display device comprising a light emitting device, a switching thin film transistor including a semiconductor active layer having a channel area for transferring a data signal to the light emitting device, and a driving thin film transistor including a semiconductor active layer having at least a channel area for driving the light emitting device so that a predetermined amount of current flows through the light emitting device according to the data signal, the channel areas of the switching thin film transistor having crystal grains with at least one of a different size and a different shape than the crystal grains in the channel area of the driving thin film transistor.

In various embodiments of the invention, the current mobilities in the channel areas of the switching TFT and the driving TFT are different from each other due to the shapes of crystal grain shapes associated with each.

In various embodiments of the invention, the current mobility in the channel area of the switching TFT may be larger than that in the channel area of the driving TFT due to the crystal grain shapes on the channel areas.

In various embodiments of the invention, the channel area of the switching TFT have crystal grains with a size different than a size of the crystal grains in the channel area of the driving TFT.

In various embodiments of the invention, the current mobility in the channel area of the switching TFT may be larger than that in the current mobility in channel area of the driving TFT due to the sizes of crystal grains associated with each.

In various embodiments of the invention, the size of crystal grains in the channel area of TFT requiring larger current mobility between the switching TFT and the driving TFT, may be larger than the size of the crystal grains in the channel area of the other TFT.

In various embodiments of the invention, the size of crystal grain on the channel area of the switching TFT may be larger than the size of the crystal grains in the channel area of the driving TFT.

In various embodiments of the invention, The channel areas of the switching TFT and the driving TFT may have differently shaped crystal grains.

Between the switching TFT and the driving TFT, the channel area of TFT requiring lower current mobility may have grain boundaries of an amorphous shape.

In various embodiments of the invention, the crystal grains in the channel area of TFT requiring a larger current mobility than that of TFT having the amorphous grain boundary may include substantially parallel primary grain boundaries, and secondary grain boundaries extending substantially perpendicularly from the primary grain boundaries between the primary grain boundaries, and the primary grain boundaries may be formed as stripes or squares.

In various embodiments of the invention, the crystal grains in the channel area of TFT requiring higher current mobility between the switching TFT and the driving TFT may include substantially parallel primary grain boundaries, and secondary grain boundaries which extend substantially perpendicularly from between the primary grain boundaries and are arranged and an average interval between them is shorter than an average interval between primary grain boundaries, the primary grain boundaries may be formed to have stripe shapes, and the channel areas may be arranged so that a direction of current flow is substantially perpendicular to the primary grain boundaries.

In various embodiments of the invention, The channel area of TFT requiring a lower current mobility than that of TFT having the primary grain boundaries of stripe shapes may have grain boundaries of amorphous shapes and/or grain boundaries having primary grain boundaries of substantially square shapes.

In various embodiments of the invention, between the switching TFT and the driving TFT, the crystal grains in the channel area of TFT requiring higher current mobility may include substantially parallel primary grain boundaries, and secondary grain boundaries extending substantially perpendicularly between the primary grain boundaries, and the primary grain boundaries may be formed to be substantially square shapes.

In various embodiments of the invention, the crystal grains in the channel area of the driving TFT may have grain boundaries of an amorphous shape.

In various embodiments of the invention, the crystal grains in the channel area of the switching TFT may have substantially parallel primary grain boundaries and secondary grain boundaries extending substantially perpendicularly from the primary grain boundaries between the primary grain boundaries, and the primary grain boundaries may be formed as stripes or squares.

In various embodiments of the invention, the crystal grains on the channel area of the switching TFT may have substantially parallel primary grain boundaries and secondary grain boundaries extending substantially perpendicularly from the primary grain boundaries between the primary grain boundaries, and the primary grain boundaries may be formed substantially as striped shapes.

In various embodiments of the invention, the crystal grains in the channel area of the driving thin film transistor may have grain boundaries of an amorphous shape and/or having primary grain boundaries of substantially square shapes.

In various embodiments of the invention, the crystal grains on the channel area of the switching thin film transistor may have substantially parallel primary grain boundaries and secondary grain boundaries extending substantially perpendicularly from the primary grain boundaries between the primary grain boundaries, and the primary grain boundaries may be formed as substantially square shapes.

In various embodiments of the invention, the channel area of the active layer may be formed using a polycrystalline silicon, and the polycrystalline silicon may be formed using a crystallization method using a laser.

BRIEF DESCRIPTION OF THE DRAWINGS

The above and other features of the invention will become more apparent by describing in detail exemplary embodiments thereof with reference to the attached drawings.

DETAILED DESCRIPTION OF THE INVENTION

Figure 1:
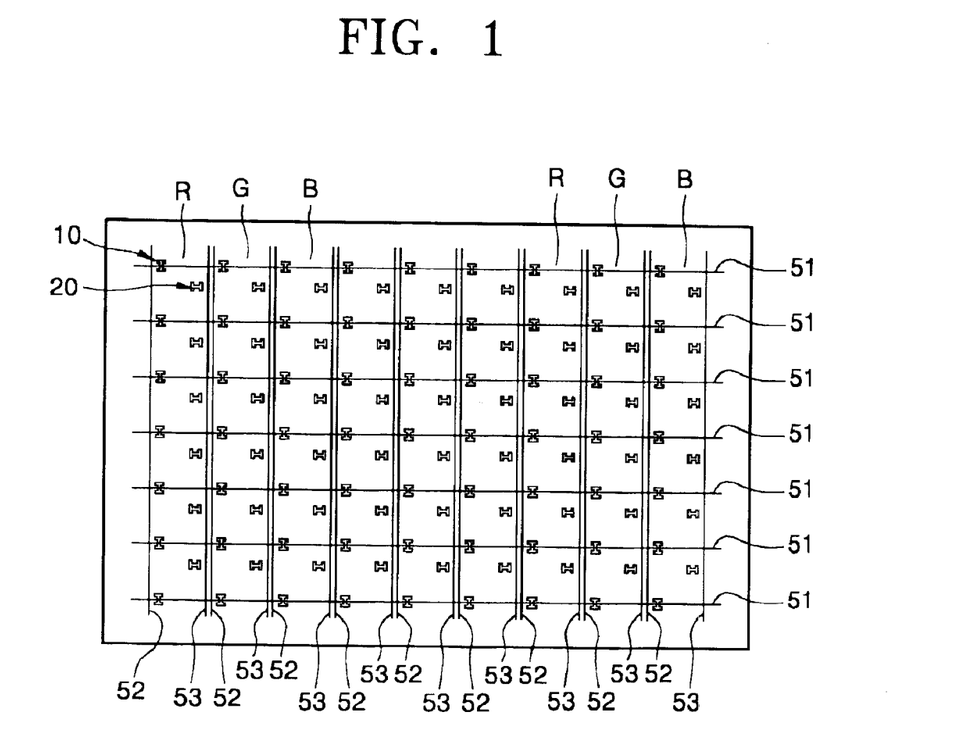
FIG. 1 is a plane view of an active layer structure of a thin film transistor (TFT) in an active matrix type organic electroluminescence display according to an exemplary embodiment of the invention.

FIG. 1 is a plane view of an active layer structure of a thin film transistor (TFT) in an active matrix type organic electroluminescence display according to an exemplary embodiment of the invention. As shown in FIG. 1, red (R), green (G), and blue (B) sub-pixels are repeatedly arranged in a longitudinal direction (up-and-down direction) in the pixels of the organic electroluminescence display. However, the arrangement of the pixels is not limited to the above structure, and the sub-pixels of respective colors can be arranged in various patterns, such as, a mosaic pattern, or a grid type pattern to construct the pixel. Also, a mono-color flat panel display can be used instead of the full-color flat panel display shown in FIG. 1.

In the organic electroluminescence display, a plurality of gate lines 51 are arranged in a transverse direction (left-and-right direction), and a plurality of data lines 52 are arranged in a longitudinal direction. Also, driving lines 53 for supplying driving voltages (Vdd) are arranged in the longitudinal direction. The gate line 51, the data line 52, and the driving line 53 are disposed to surround one sub-pixel.

In above construction, each sub-pixel of the R, G, and B pixels includes at least two TFTs such as a switching TFT and a driving TFT. The switching TFT transfers a data signal to a light emitting device according to a signal of the gate line 51 to control operations of the light emitting device, and the driving TFT drives the light emitting device so that a predetermined current flows on the light emitting device based on the data signal. The number of TFTs and the arrangement of TFTs, such as, the arrangement of the switching TFT and the driving TFT can be varied based on the properties of the display device and a driving method of the display device, and TFTs can be arranged in various ways.

The switching TFT 10 and the driving TFT 20 include a first active layer 11 and a second active layer 21 respectively. Semiconductor active layers, and the active layers 11 and 21 include channel areas (not shown) which will be described later. The channel areas are the areas located on center portions of the first active layer 11 and the second active layer 21 in a current flowing direction.

As shown in FIG. 1, in sub-pixels forming the R, G, and B pixels, the first active layer 11 included in the switching TFT 10 and the second active layer 21 included in the driving TFT 20 can be formed such that the first active layer 11 and the second active layer 21 have different crystal grains. The first active layer 11 and the second active layer 21 can be formed commonly to the R, G, and B pixels. However the first active layer 11 and the second active layer 21 can also be formed differently for the R, G, and B pixels, so that a white balance can be maintained by making different crystal grains for different colors on the second active layer 21 forming the driving TFT 20 (this is not shown in drawings).

According to an embodiment of the invention, the first active layer 11 and the second active layer 21 can be formed using a polycrystalline silicon thin film. The first active layer 11 and the second active layer 21 formed by the polycrystalline silicon thin film can be formed differently. In the embodiment of the invention shown in FIG. 1, the first active layer 11 and the second active layer 21 can be formed to have the crystal grains of different shapes. Here, it is sufficient that the crystal grains on the channel areas of the first active layer 11 and the second active layer 21 have different shapes from each other, however, the crystal grains on the entire first and second active layers 11 and 21 have different shapes from each other due to a complexity in designing the structure.

According to the embodiment of the invention, since the crystal grains on the channel areas of the first active layer 11 of the switching TFT 10 and the second active layer 21 of the driving TFT 20 have different shapes, a current transferred from the driving TFT to the light emitting device is reduced while having active layers have same sizes to achieve high resolution.

As described above, in the organic electroluminescence display, in order to form a TFT suitable for the high resolution, especially, for the high resolution of a small size, an on-current of the switching TFT increases and an on-current of the driving TFT decreases. In the invention, the on-currents of TFTs are controlled by forming the crystal grains on the active layers of TFTs to have different shapes. That is, the on-current of the switching TFT is increased and the on-current of the driving TFT is lowered by controlling the shapes of the crystal grains on the active layers of the switching TFT and the driving TFT.

Therefore, the crystal grain shape on the active layer of the switching TFT and the crystal grain shape on the active layer of the driving TFT can be decided according to the current mobilities in the channel area of the active layers. When the current mobility is large in the channel area of the active layer, the on-current becomes large, and when the current mobility in the channel area is small, the on-current becomes small. Consequently, in order to achieve high resolution by lowering the on-current of the driving TFT, the current mobility in the channel area of the driving TFT active layer should be controlled to be lower than that in the channel area of the switching TFT active layer.

The difference between the current mobilities can be obtained based on the shape of crystal grains in the polycrystalline thin film forming the active layer. In particular, the difference between the current mobilities can be obtained according to the crystal grain shape of the polycrystalline silicon thin film.

That is, the shapes of crystal grains on the first and second active layers 11 and 21 of the switching TFT 10 and the driving TFT 20 can be decided by the current mobilities in the channel areas of respective active layers, since the on-current of a TFT can be increased when the current mobility is large in the channel area of the active layer, and the on-current of the TFT can be lowered when the current mobility is small on the channel area.

Therefore, shapes of the respective active layers should be controlled so that the current mobility in the channel area of the second active layer 21 in the driving TFT is lower than that of the first active layer 11 of the switching TFT for lowering the on-current on the driving TFT. The difference in the current mobilities can be obtained based on the crystallization structure of the polycrystalline silicon thin film forming the active layer. That is, the difference in the current mobilities can be achieved by forming the respective layers on polycrystalline silicon thin films having different crystallization structures.

Figure 2:
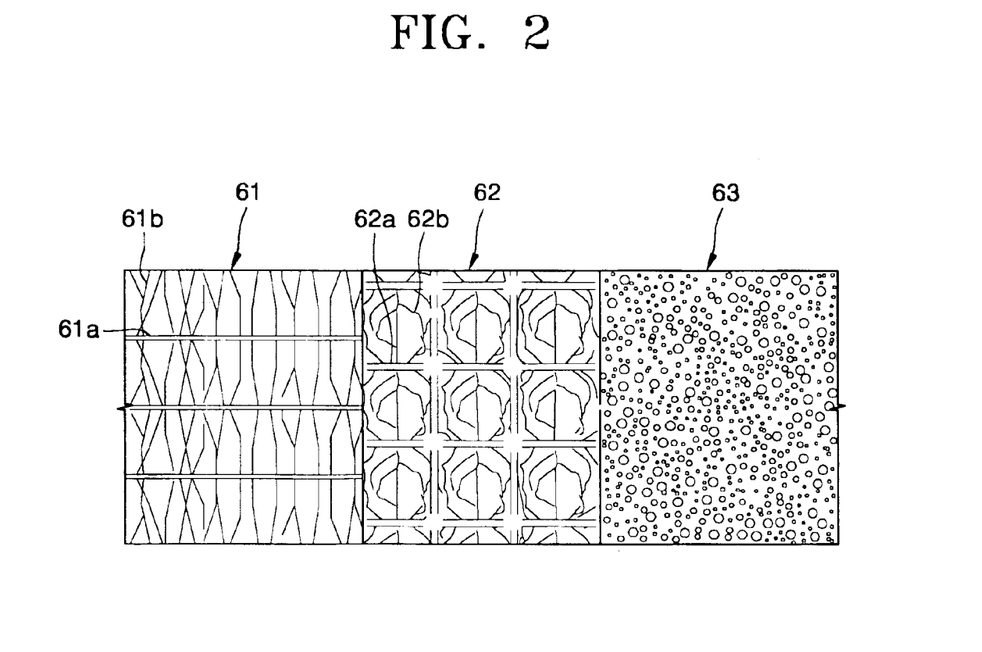
FIG. 2 is a plane view of crystalline structures having different shapes from each other in a polycrystalline silicon thin film forming the active layer of the TFT.

FIG. 2 is a view of various crystallization structures of a polycrystalline thin film forming the active layer of TFT. The polycrystalline silicon thin film can be formed by crystallizing an amorphous silicon thin film using a sequential lateral solidification (SLS) method. SLS method uses a fact that the crystal grain of the silicon grows toward in a vertical direction at an interface between a liquid phase silicon region and a solid phase silicon region. A part of the amorphous silicon is melted by transmitting a laser beam using a mask, and the grain grows toward the melted silicon part from the interface between the melted silicon part and the non-melted silicon part.

The crystallization structure in FIG. 2 can be obtained by using different masks for different regions when performing SLS method on the thin film.

In a first crystallization structure 61 with a stripe shape, a plurality of primary grain boundaries 61a which are straight lines parallel to each other are formed, and a second grain boundary 61b in a vertical direction at the primary grain boundaries 61a. Also, a length for a direction of the crystal grain having the above grain boundary structures is formed to be longer than the width of that crystal grain. The length may be at least about 1.5 times longer than the shorter side or more.

The first crystallization structure 61 is formed by melting and crystallizing the amorphous silicon thin film using a mask and a laser beam transmitting area of stripe shape. When the active layer of TFT is formed on the first crystallization structure, a difference in current mobility (see FIG. 3) can be achieved based on an angle of the primary grain boundary 61a with the direction of current flow in the channel area of the active layer. That is, the current mobility is the largest when the primary grain boundary is perpendicular to the direction of current flow in on the channel area of the active layer, and the current mobility is the smallest when the primary grain boundary 61a is parallel with the direction of current flow in the channel area of the active layer. Therefore, when the channel area of TFT active layer is formed on the first crystallization structure 61 to be perpendicular for the primary grain boundary 61a, high current mobility can be achieved.

Figure 3:
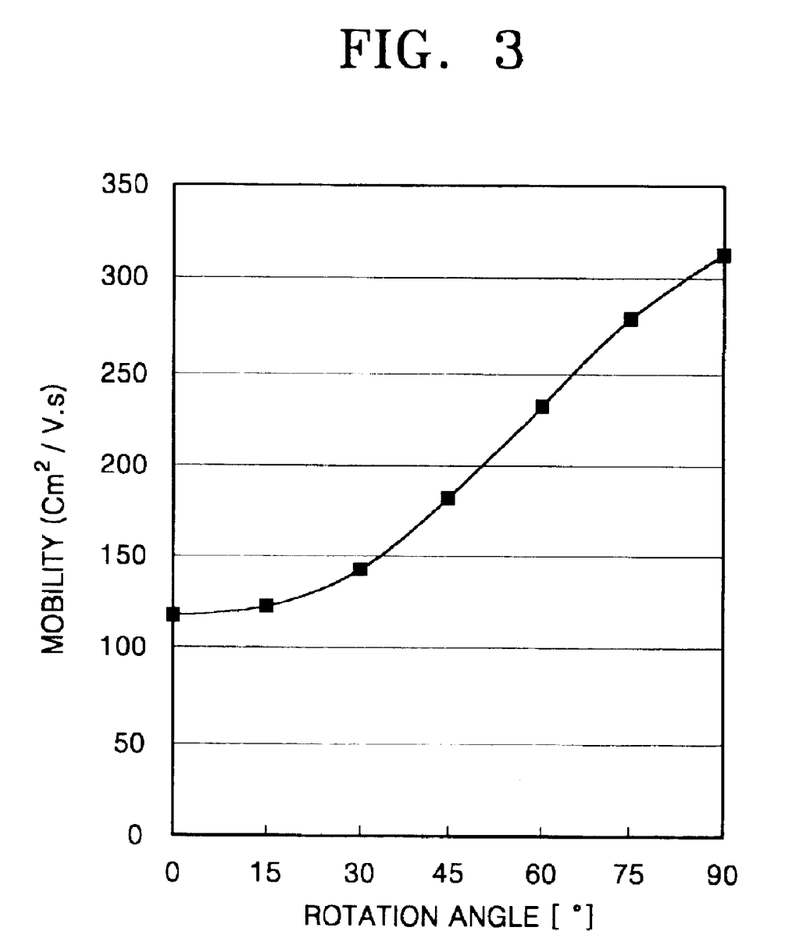
FIG. 3 is a graph showing a relation between an angle of primary grain boundaries for a length of a channel area and a current mobility on the channel area.

The above relation can be described by resistance components for movements of a carrier. When an angle between the current flowing direction with the primary grain boundary 61a is 0° in the channel area of the active layer, the direction of current flow is parallel with the primary grain boundary 61a, however, the direction of current flow is perpendicular to a plurality of secondary grain boundaries 61b. Therefore, when the carrier moves, the moving direction of the carrier is perpendicular to the secondary grain boundary 61b, thus increasing the resistance components toward movement of the carrier and lowering the current mobility.

On the contrary, when an angle of the direction of current flow in the primary grain boundary 61a is 90°, the direction of current flow is perpendicular to the primary grain boundary 61a, however, the direction of current flow is parallel to a plurality of secondary grain boundaries 61b. Therefore, the secondary grain boundary 61b is parallel to the moving direction of the carrier when the carrier moves, thus reducing the resistance components toward carrier movement of the carrier and increasing the current mobility.

The difference in the current mobilities causes the difference in on-currents. That is, as the angle made by the primary grain boundary with the direction of current flow in the channel area of the active layer is increased, the current mobility becomes larger, and accordingly, the on-current also increases. Therefore, as described above, a channel area of the switching TFT requiring a high on-current value can be designed to make an angle of about 90°, for example, with the direction of current flow and not an angle of 0° for direction of current flow.

In a second crystallization structure 62, primary grain boundary 62a is formed as rectangle, and can be fabricated using a mask on which a laser beam transmitting area of stripe shapes and a laser beam shielding area of dot shapes are mixed when performing the SLS method. When the active layer of TFT is formed on the rectangular crystallization structure, a smaller current mobility value than that of the first crystallization structure 61 can be obtained.

A third crystallization structure 63 has very small sized and shapeless grains. The crystal grains in the third crystallization structure are formed using a flood radiation method in applying SLS method. A plurality of grain cores are formed by radiating laser over the silicon without using a mask, and the grains grow to obtain the crystal grains of fine and dense distribution, as shown in FIG. 2. When the active layer of TFT is formed on the shapeless third crystallization structure, a smaller current mobility value than the current mobility value in either of the above structures is obtained.

Figure 4:
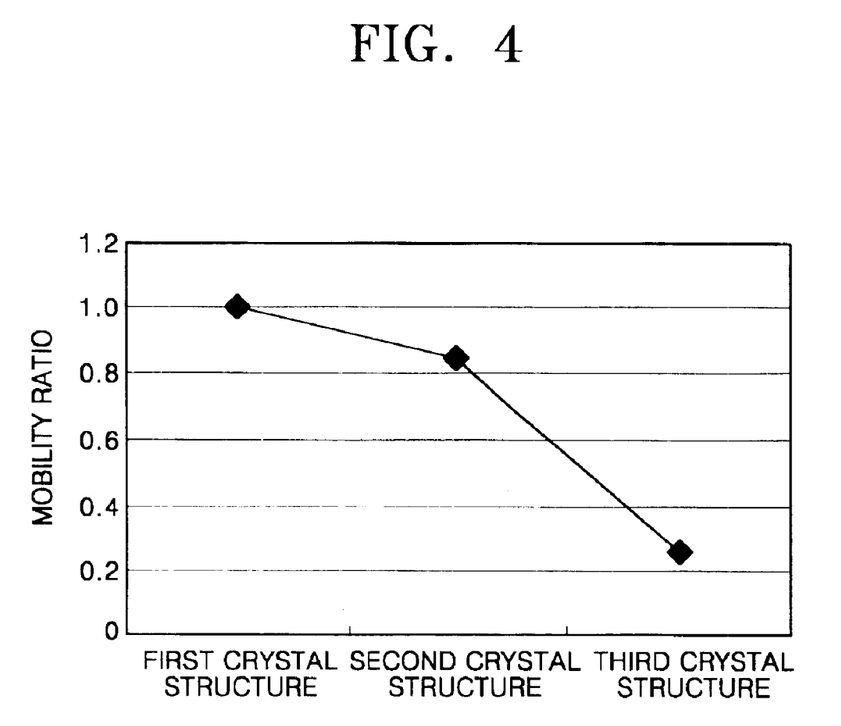
FIG. 4 is a graph of a ratio between current mobilities of respective active layers in a case where the TFT is formed on the different crystallization structures of FIG. 2.

FIG. 4 is a view of a ratio of current mobilities when the active layers are formed on the first, second and through third crystallization structures. As the current mobility can be changed according to the shape of crystallization structure, the switching TFT and the driving TFT can be formed in various ways, as shown in FIGS. 5 through 7.

Figure 5:
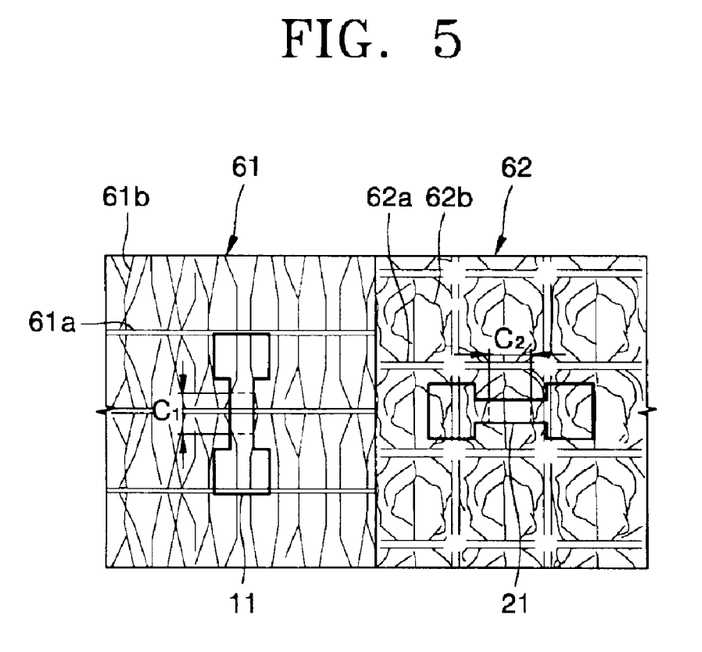
FIG. 5 is a plane view of a state where a first active layer is formed on a first crystallization structure and a second active layer formed on a second crystallization layer.
Figure 6:
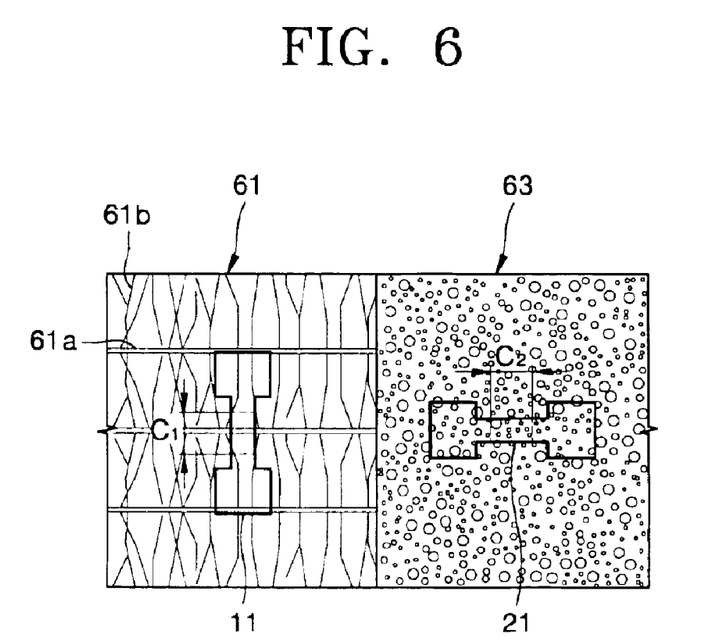
FIG. 6 is a plane view showing that the first active layer is formed on the first crystallization structure and the second active layer is formed on a third crystallization structure.

As shown in FIGS. 5 and 6, when the first active layer 11 of the switching TFT is formed on the first crystallization structure 61, the second active layer 21 of the driving TFT may be formed on the second crystallization structure 62 or on the third crystallization structure 63. Here, it is preferable that the primary grain boundary 61a of the first crystallization structure 61 be disposed such that they are perpendicular to the direction of current flow on the channel area (C1) of the first active layer 11 which is formed on the first crystallization structure 61 to improve the current mobility. According to the above structure, the current mobility in the channel area (C2) of the second active layer 21 is smaller than that of the first active layer 11, and the on-current value of the driving TFT can be lowered.

Figure 7:
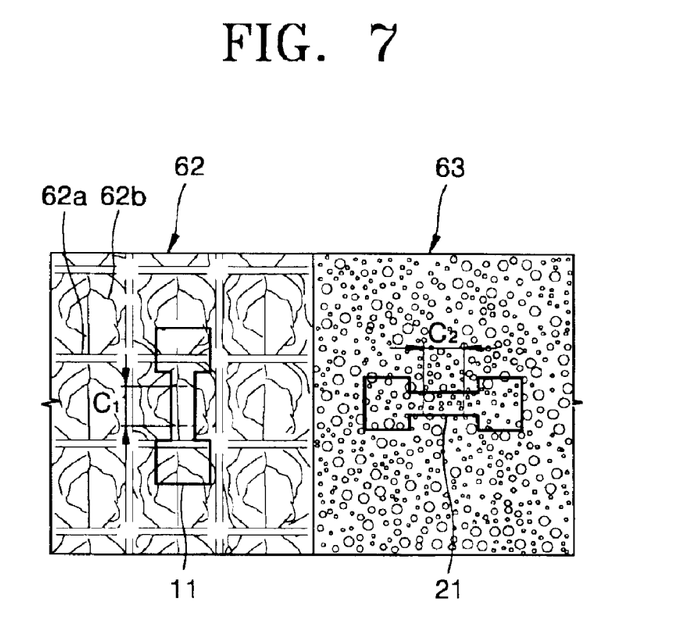
FIG. 7 is a plane view of a status that the first active layer is formed on the second crystallization structure and the second active layer is formed on the third crystallization structure.

Also, as shown in FIG. 7, when the first active layer 11 of the switching TFT is formed on the second crystallization structure 62, the second active layer 21 of the driving TFT may be formed on the third crystallization structure 63. As discussed above, the difference in the current mobilities is generated due to the difference in the crystallization structure, and the current mobility of the channel area C2 of the second active layer is smaller than that of the first active layer 11. Thus lowering the on-current value of the driving TFT is lower.

It should be understood by one of ordinary skill in the art that the different crystallization structures of TFT active layers are not limited to the above structures. That is, when the third crystallization structure for example, may be adopted for the active layer of TFT requiring smaller current mobility between the switching TFT and the driving TFT, the first or second crystallization structure is adopted for the active layer of TFT requiring larger current mobility. When the first crystallization structure is adopted for the active layer of TFT requiring larger current mobility between the switching TFT and the driving TFT, the second or third crystallization structure ma, for example, be adopted for the active layer of TFT requiring smaller current mobility. It should be also understood by one of ordinary skill in the art that the invention is not limited to use of the shown crystallization structures. That is, different crystallization structures with different grain sizes may be used.

Figure 8:
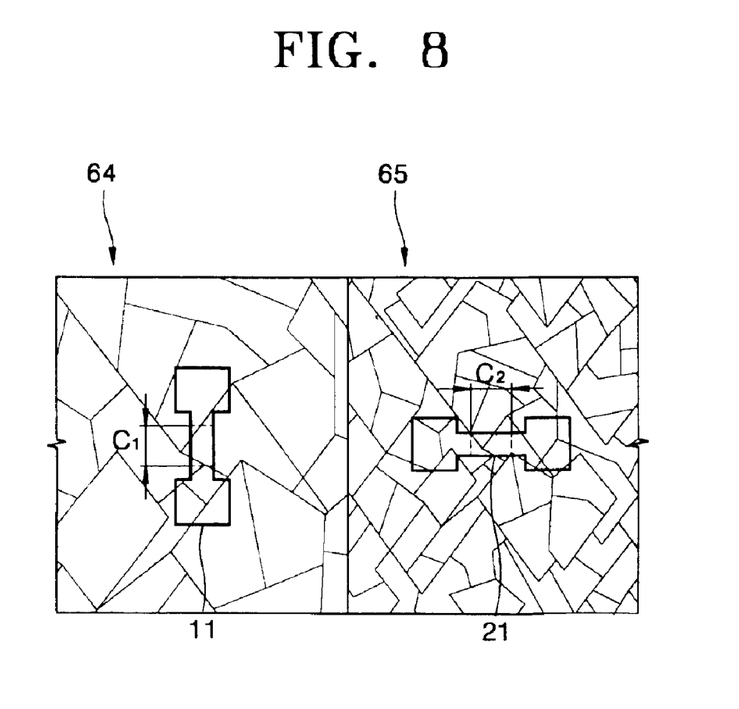
FIG. 8 is a plane view of a status that the first active layer and the second active layer are formed on a polycrystalline silicon thin film having crystallization structures of different sizes.

In addition, as shown in FIG. 8, the above effect can be obtained by differentiating sizes of the crystal grains forming the channel areas of the respective TFT active layers. According to another embodiment of the invention shown in FIG. 5, the grain is crystallized using an excimer laser annealing (ELA) method, and the sizes of grains are differentiated by radiating different energies to the switching TFT and the driving TFT.

Figure 9:
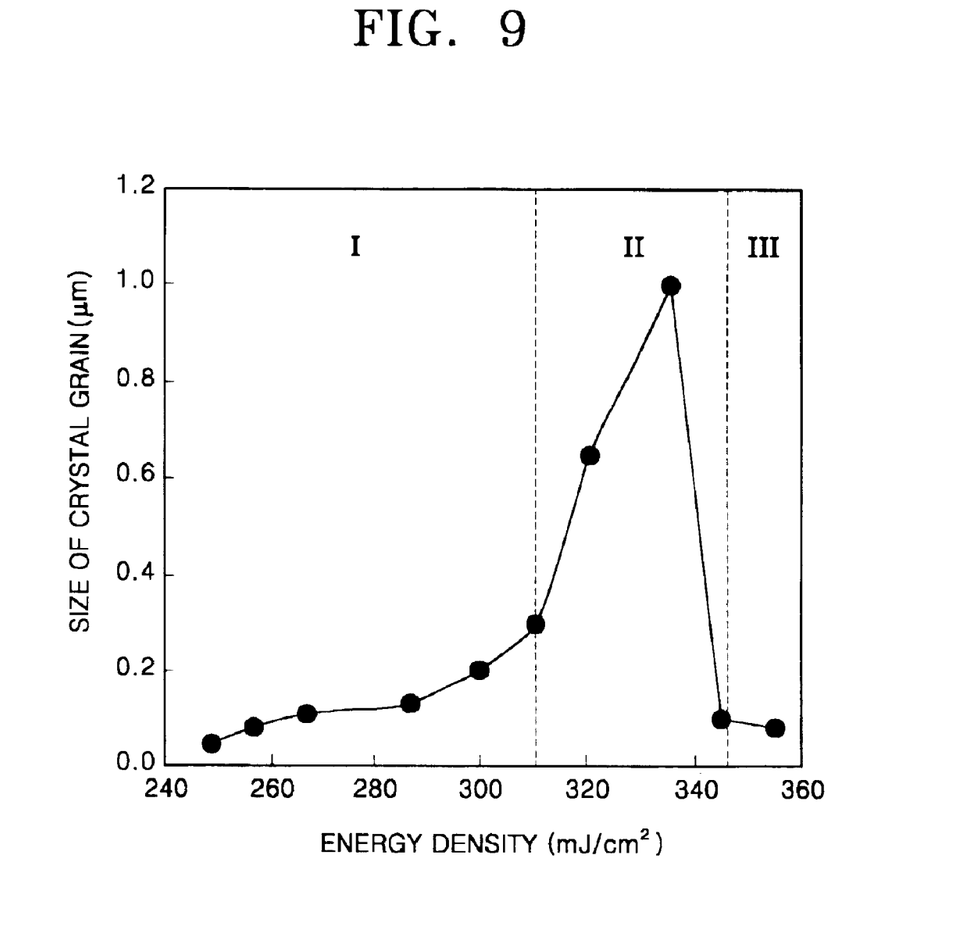
FIG. 9 is a graph of a relation between an energy density and a size of crystal grain in an excimer laser annealing (ELA) crystallization method.

In ELA method, the sizes of crystal grains can be differentiated according to densities of the radiated energy as shown in FIG. 9. A difference between the sizes of crystal grains according to the energy densities of the laser in crystallizing the amorphous silicon thin film of 500 Å in ELA method is shown in FIG. 9.

In FIG. 9, Region I represents a case that a partial melting is generated on the amorphous silicon by irradiating the amorphous silicon with a laser with a relatively lower energy density, the crystal grains grow in a perpendicular direction due to the partial melting of the amorphous silicon to form the grains of small sizes.

Region II represents a case that a near complete melting is generated on the amorphous silicon by irradiating the amorphous silicon with a laser with a relatively higher energy density, and the crystal grains grow in a lateral direction from a few solid phase crystal germs which are not melted to form the crystal grains of larger sizes.

Region III represents a case that a complete melting is generated on the amorphous silicon by irradiating the amorphous silicon with a laser with the relatively highest energy density, and a plurality of crystal germs are generated by supercooling the melted silicon to grow fine crystal grains.

Therefore, the size of crystal grain in Region II is the largest, then the size becomes smaller in order of Region I and then Region III.

In a case where the sizes of crystal grains are different from each other, the current mobilities according to the sizes are also different. That is, as shown in FIG. 10, the larger the size of crystal grain is, the larger the current mobility is, thus forming a nearly straight line graph.

Figure 10:
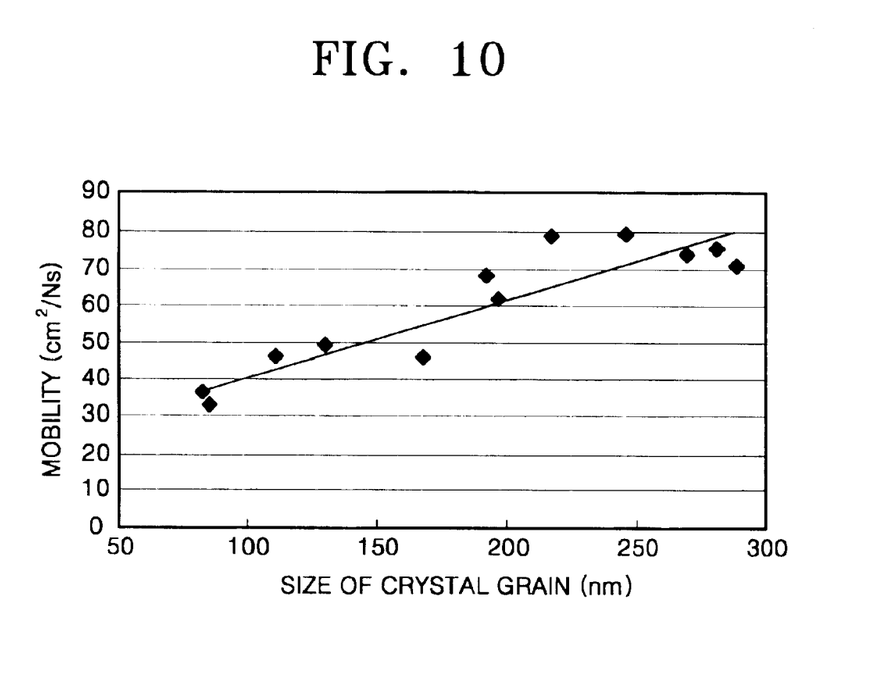
FIG. 10 is a graph of a relation between a size of crystal grain and a current mobility.

As shown in FIGS. 9 and 10, when the crystal grain is crystallized according to region II in which the largest grain can be formed, the largest current mobility can be obtained, and when the crystal grain is crystallized according to region III in which the smallest grain can be formed, the smallest current mobility can be obtained.

When the above result is applied to the embodiment of the invention shown in FIG. 8, the first active layer 11 of the switching TFT is formed on a fourth crystallization structure 64 having larger crystal grains, and the second active layer 21 of the driving TFT is formed on a fifth crystallization structure 65 having smaller crystal grains. Then, smaller current mobility in the channel area of the second active layer 21 of the driving TFT can be obtained, and accordingly, the on-current value of the driving TFT can be lowered.

Therefore, generally if the fourth crystallization structure 64 on which the first active layer 11 of the switching TFT is crystallized in the region II of FIG. 10, the fifth crystallization structure 65 on which the second active layer 21 of the driving TFT is formed may be crystallized in Region I or in Region III of FIG. 10. Also, generally if the fourth crystallization structure 64 on which the first active layer 11 of the switching TFT is formed may be crystallized in Region I of FIG. 10, the fifth crystallization structure 65 on which the second active layer 21 of the driving TFT is formed may be crystallized in Region III of FIG. 10.

The different crystallization structures are not limited thereto, and if the active layer of TFT requiring smaller current mobility between the switching TFT and the driving TFT is crystallized in Region III of FIG. 10, the active layer of TFT requiring larger current mobility may be crystallized in Region I or Region II. Also, if the active layer of TFT requiring larger current mobility between the switching TFT and the driving TFT is crystallized in Region II of FIG. 10, the active layer of TFT requiring smaller current mobility is crystallized in Region I or Region III.

As described above, when the crystal grains of different sizes are formed on the switching TFT 10 and the driving TFT 20 and the first and second active layers 11 and 21 are formed thereon. The current mobilities of the switching TFT and the driving TFT are differentiated from each other, and the on-current value of the driving TFT 20 is lowered to realize a high resolution.

On the other hand, respective sub-pixels of the organic electroluminescence display device having the switching TFT and the driving TFT have a structure shown in FIGS. 11 through 14.

Figure 11:
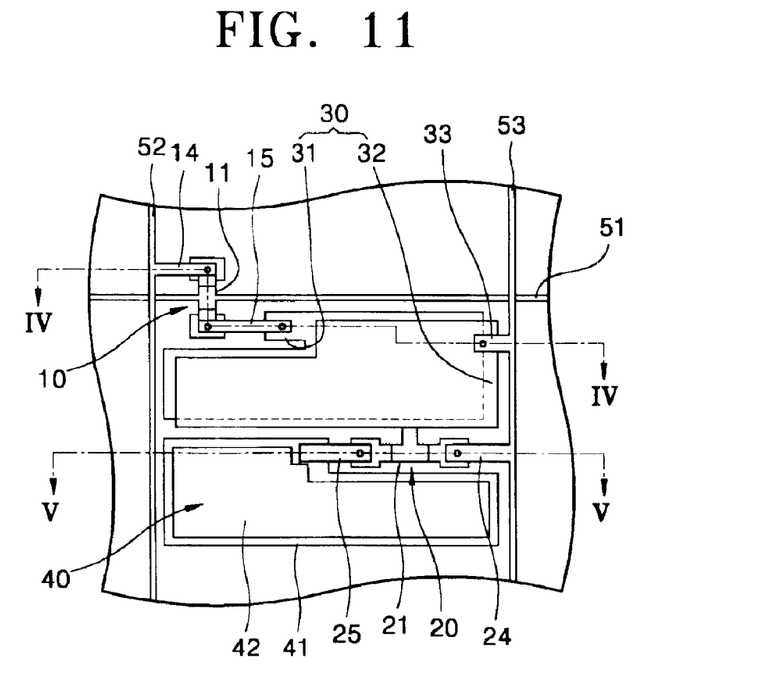
FIG. 11 is a partially enlarged plane view of a sub-pixel of a pixel shown in of FIG. 1.
Figure 12:
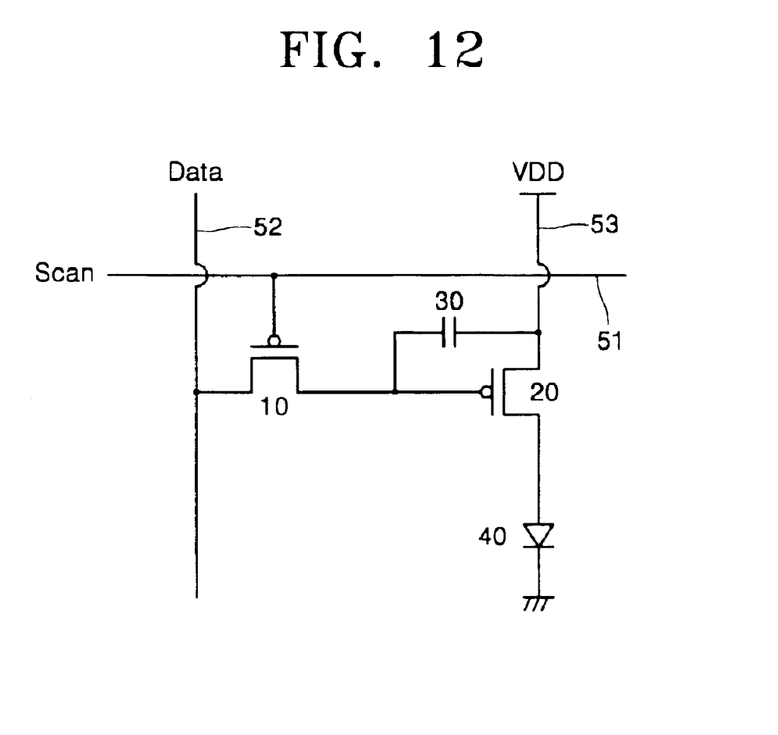
FIG. 12 is an equivalent circuit diagram of a unit pixel shown in FIG. 11.

FIG. 11 is a partially enlarged plane view of a sub-pixel among the pixels shown in FIG. 1, and FIG. 12 is a view of an equivalent circuit for the sub-pixel shown in FIG. 11.

Referring to FIG. 12, the respective sub-pixel of the active matrix type organic electroluminescence display according to an embodiment of the invention comprises two TFTs such as a switching TFT 10 for switching, a driving TFT for driving, a capacitor 30 and an electroluminescence (EL) device 40. The number of TFTs and the number of capacitors are not limited thereto, and more TFTs and capacitors can be disposed according to a design of desired device.

The switching TFT 10 is operated by a scan signal which is applied to the gate line 51 to transfer a data signal which is applied to the data line 52. The driving TFT 20 decides a current flowing into the EL device 40 according to the data signal transferred through the switching TFT 10, that is, voltage difference (Vgs) between a gate and a source. The capacitor 30 stores the data signal transferred through the switching TFT 10 for one frame unit.

Figure 13:
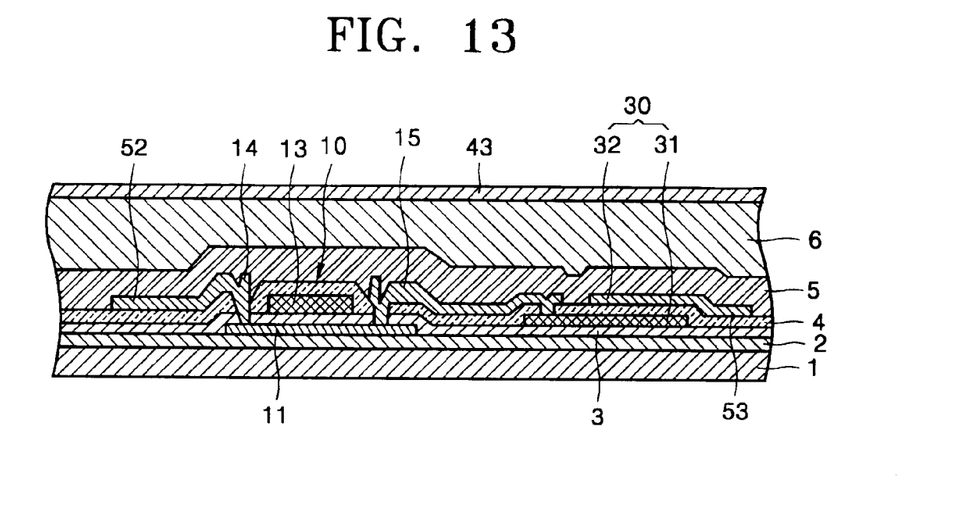
FIG. 13 is a cross-sectional view of line IV—IV direction in FIG. 11.
Figure 14:
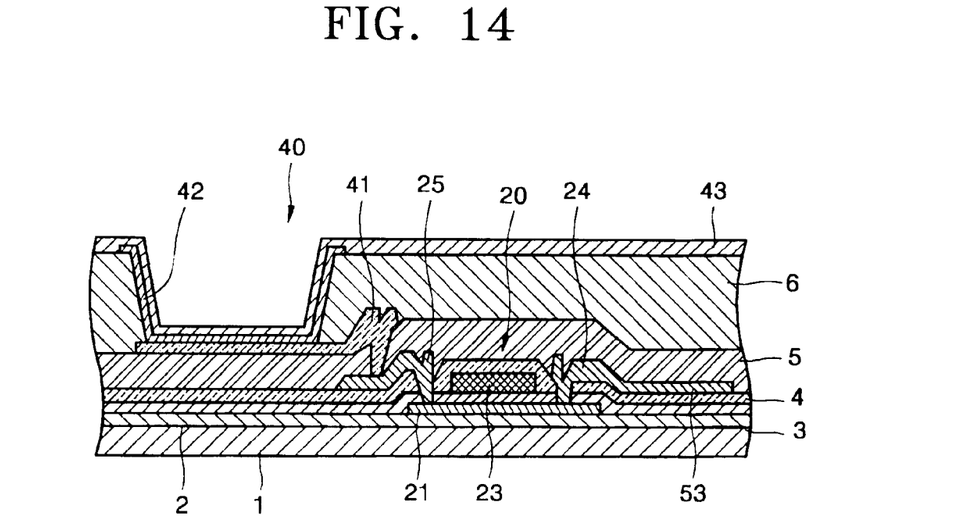
FIG. 14 is a cross-sectional view of line V—V direction in FIG. 11.

The organic electroluminescence display devices having the structure shown in FIGS. 11, 13, and 14 are formed to realize the above circuit. As shown in FIGS. 11, 13, and 14, a buffer layer 2 is formed on an insulating substrate 1 made of glass, and the switching TFT 10, the driving TFT 20, the capacitor 30, and the EL device 40 are disposed on the buffer layer 2.

As shown in FIGS. 11 and 13, the switching TFT 10 includes a gate electrode 13 connected to the gate line 51 for applying TFT on/off signals, a source electrode 14 formed on the gate electrode 13 and connected to the data line 52 for supplying the data signal to the first active layer, and a drain electrode 15 connecting the switching TFT 10 with the capacitor 30 to supply power source to the capacitor 30. A gate insulating layer 3 is disposed between the first active layer 11 and the gate electrode 13.

The capacitor 30 for charging is located between the switching TFT 10 and the driving TFT 20 for storing a driving voltage required to drive the driving TFT 20 for one frame unit, and may include a first electrode 31 connected to the drain electrode 15 of the switching TFT 10, a second electrode 32 formed to overlap the first electrode 31 on an upper part of the first electrode 31 and connected to a driving line 53 through which the power source is applied, and an interlayer dielectric layer 4 formed between the first electrode 31 and the second electrode 32 to be used as a dielectric substance, as shown in FIGS. 11 and 13. The structure of the capacitor 30 is not limited to the above, for example, the silicon thin film of TFT and the conductive layer of the gate electrode may be used as first and second electrodes, and a gate insulating layer may be used as the dielectric layer.

As shown in FIGS. 11 and 14, the driving TFT 20 includes a gate electrode 23 connected to the first electrode 31 of the capacitor 30 for supplying TFT on/off signals, a source electrode 24 formed on an upper part of the gate electrode 23 and connected to the driving line 53 for supplying a reference common voltage to the second active layer 21, and a drain electrode 25 connecting the driving TFT 20 with the EL device 40 for applying a driving voltage to the EL device 40. A gate insulating layer 3 is disposed between the second active layer 21 and the gate electrode 23. Here, the channel area of the second active layer 21 of the driving TFT 20 has a different crystallization structure from that of the channel area of the first active layer 11 of the switching TFT 10, that is, the crystal grains of different shape or different size.

On the other hand, the EL device 40 displays a predetermined image information by emitting lights of red, green, and blue colors according to the current flow. As shown in FIGS. 11 and 14, the EL device 40 includes an anode electrode 41 connected to the drain electrode 25 of the driving TFT 20 for receiving positive power source from the drain electrode 25, a cathode electrode 43 disposed to cover the entire pixel for supplying negative power source, and an organic emission layer 42 disposed between the anode electrode 41 and the cathode electrode 43 for emitting lights. Reference numeral 5 denotes an insulating passivation layer made of $SiO_2$, and reference numeral 6 denotes an insulating planarized layer made of acryl, or polyimide.

The above layered structure of the organic electroluminescence display according to the embodiment of the invention is not limited thereto, and the invention can be applied to any different structures from the above.

The organic electroluminescence display having the above structure according to the embodiment of the invention can be fabricated as follows.

As shown in FIGS. 13 and 14, a buffer layer 2 is formed on an insulating substrate1 of glass material. The buffer layer 2 can be formed using, for example, $SiO_2$ and can be deposited using, for example, a plasma enhanced chemical vapor deposition (PECVD) method, an atmospheric pressure chemical vapor deposition (APCVD) method, a low pressure chemical vapor deposition (LPCVD) method, or an electron cyclotron resonance (ECR) method. Also, the buffer layer 2 can be deposited to have a thickness about 3000 Å.

An amorphous silicon thin film is deposited on an upper part of the buffer layer 2 to have a thickness about 500 Å.

The amorphous silicon thin film can be crystallized into the polycrystalline silicon thin film in various ways. Here, the crystallization to the polycrystalline silicon thin film can be performed in such way that a portion where the switching TFT will be formed and a portion where the driving TFT will be formed are classified, and the portion on which the switching TFT will be formed is crystallized to have larger current mobility and the portion on which the driving TFT will be formed is crystallized to have smaller current mobility. Therefore, as described above, the area on which the switching TFT will be formed and the area on which the driving TFT will be formed are crystallized to have the structure shown in FIGS. 5 through 7 in a case where the crystallization is performed using SLS method, and the area on which the switching TFT will be formed and the area on which the driving TFT will be formed are crystallized to have the structure shown in FIGS. 8 and 9 in a case where the crystallization is performed using ELA method. Also, the above crystallization structures can be formed in various ways.

After forming different crystallization structures, the first active layer 11 of the switching TFT 10 and the second active layer 21 of the driving TFT 20 are patterned on the areas as shown in FIG. 1 to form the first active layer 11 and the second active layer 21 of different shapes.

After performing the patterning process of the active layers, the gate insulating layer is deposited on the patterned layers in PECVD, APCVD, LPCVD, or ECR method, and a conductive layer is formed using MoW, or Al/Cu and patterned to form the gate electrode. The active layer, the gate insulating layer, and the gate electrode may be patterned in various orders and methods.

After patterning the active layer, the gate insulating layer, and the gate electrode, N-type or P-type impurities are doped on the source and drain areas. As shown in FIGS. 13 and 14, after completing the doping process, an interlayer dielectric layer 4 is formed, the source electrodes 14 and 24 and the drain electrodes 15 and 25 are connected to the active layers 11 and 21 through contact holes, and a passivation layer 5 is formed. The layers may adopt various structures according to design of the device.

On the other hand, the EL device 40 connected to the driving TFT 20 can be formed in various ways, for example, an anode electrode 41 connecting to the drain electrode 25 of the driving TFT 20 may be formed and patterned on the passivation layer 5 using, for example, an indium tin oxide (ITO), and a planarized layer 6 may be formed on the anode electrode 41. In addition, after exposing the anode electrode 41 by patterning the planarized layer 6, an organic layer 42 is formed thereon. Here, the organic layer 42 may use a low molecular organic layer or a high molecular organic layer. In a case where the low molecular organic layer is used, a hole injection layer, a hole transfer layer, an organic emission layer, an electron transfer layer, and an electron injection layer may be formed by being stacked in a single or a combination structure. Also, various organic materials such as copper phthalocyanine (CuPc), N,N-Di (naphthalene-1-y1)-N, N'-diphenyl-benzidine (NPB), and tris-8-hydroxyquilnoline aluminum (Alq3) can be used. The low molecular organic layer is formed using, for example, a vacuum evaporation method.

The high molecular organic layer may include the hole transfer layer and an emission layer. Here, the hole transfer layer is formed using poly(3,4-ethylenedioxythiophene) (PEDOT), and the emission layer is formed using a high molecular organic material such as polyphenylenevinylene (PPV)-based material or polyfluorene-based material in a screen printing method or in an inkjet printing method.

After forming the organic layer, the cathode electrode 43 may be entirely deposited using Al/Ca, or patterned. The cathode electrode 43 may be formed as a transparent electrode in a case where the organic electroluminescence display device is a front light emitting type. An upper part of the cathode electrode 43 is sealed by a glass or a metal cap.

In above descriptions, the invention is applied to the organic electroluminescence display device, however, the scope of the present invention is not limited thereto. The TFT according to the present invention can be applied to any display devices such as a liquid crystal display (LCD), and inorganic electroluminescence display devices.

According to the invention, a current transferred from the driving TFT to the light emitting device can be reduced without changing the size of the active layer in TFT or the driving voltage, and accordingly, a structure suitable for realizing the high resolution can be obtained. A switching TFT having excellent switching properties can be obtained, and at the same time, a driving TFT by which the high resolution can be realized can be obtained using properties of the polycrystalline silicon. In addition, uniform brightness can be obtained and life time degradation can be prevented using crystallization structures of TFT. Also, the aperture area is not reduced since there is no need to increase the length (L) of the driving TFT, and a reliability of TFT can be improved since there is no need to reduce the width (W) of the driving TFT.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A flat panel display comprising:
    a light emitting device;
    a switching thin film transistor including a semiconductor active layer having a channel area for transferring a data signal to the light emitting device; and
    a driving thin film transistor including a semiconductor active layer having a channel area for driving the light emitting device so that a predetermined current flows through the light emitting device according to the data signal,
    wherein the channel area of the switching thin film transistor has crystal grains having an average size that is different from an average size of crystal grains in the channel area of the driving thin film transistor.

2. The flat panel display of claim 1, wherein the current mobility in the channel area of the switching thin film transistor is larger than the current mobility in the channel area of the driving thin film transistor due to the average size of crystal grains associated with each.

3. The flat panel display of claim 1, wherein between the switching thin film transistor and the driving thin film transistor, an average size of crystal grains in the channel area of the thin film transistor requiring a larger current mobility is larger than an average size of crystal grains in the channel area of the thin film transistor with a lower current mobility.

4. The flat panel display of claim 1, the average size of crystal grains in the channel area of the switching thin film transistor is larger than the average size of crystal grain in the channel area of the driving thin film transistor.

5. The flat panel display of claim 1, wherein the channel area of the active layer of the driving thin film transistor and the channel area of the switching thin film transistor is formed using a polycrystalline silicon.

6. The flat panel display of claim 5, wherein the polycrystalline silicon is formed using a crystallization method using a laser.

7. The flat panel display of claim 1, wherein the channel area of the switching thin film transistor and the channel area of the driving thin film transistor have different current mobilities due to the crystal grain associated with each.

8. The flat panel display of claim 7, wherein the current mobility in the channel area of the switching thin film transistor is greater than the current mobility in the channel area of the driving thin film transistor due to the crystal grains associated with each.

9. A flat panel display comprising:
    a light emitting device;
    a switching thin film transistor including a semiconductor active layer having a channel area for transferring a data signal to the light emitting device; and
    a driving thin film transistor including a semiconductor active layer having a channel area for driving the light emitting device so that a predetermined current flows through the light emitting device according to the data signal,
    wherein the channel area of the switching thin film transistor has crystal grains having a different shape than crystal grains in the channel area of the driving thin film transistor.

10. The flat panel display of claim 9, wherein between the switching thin film transistor and the driving thin film transistor the channel area of the thin film transistor requiring a lower current mobility have shapeless grain boundaries.

11. The flat panel display of claim 10, wherein the crystal grains in the channel area of the thin film transistor requiring a larger current mobility than the current mobility of the thin film transistor having the shapeless grain boundaries includes substantially parallel primary grain boundaries, and secondary grain boundaries extending in a substantially perpendicular direction from the primary grain boundaries between the primary grain boundaries, and the primary grain boundaries are formed as a stripe or a rectangle.

12. The flat panel display of claim 9, wherein between the switching thin film transistor and the driving thin film transistor, the crystal grains in the channel area of the thin film transistor requiring higher current mobility include substantially parallel primary grain boundaries, and secondary grain boundaries which extend in a substantially perpendicular direction from the primary grain boundaries between the primary grain boundaries and are arranged with an average interval which is shorter than an average interval of primary grain boundaries, the primary grain boundaries are formed to have stripe shapes, and the channel areas are arranged so that a flowing direction of the current is vertical for the primary grain boundaries.

13. The flat panel display of claim 12, wherein the channel area of the thin film transistor requiring lower current mobility than that of the thin film transistor having the primary grain boundaries of stripe shapes include at least one of shapeless grain boundaries and grain boundaries having primary grain boundaries of substantially rectangular shapes.

14. The flat panel display of claim 9, wherein between the switching thin film transistor and the driving thin film transistor, the crystal grains in the channel area of the thin film transistor requiring higher current mobility include substantially parallel primary grain boundaries, and secondary grain boundaries extending substantially perpendicular from the primary grain boundaries between the primary grain boundaries, and the primary grain boundaries have substantially rectangular shapes.

15. The flat panel display of claim 9, wherein the crystal grains in the channel area of the driving thin film transistor have shapeless grain boundaries.

16. The flat panel display of claim 15, wherein the crystal grains in the channel area of the switching thin film transistor have substantially parallel primary grain boundaries and secondary grain boundaries extending substantially perpendicularly from toward vertical direction for the primary grain boundaries between the primary grain boundaries, and the primary grain boundaries are formed as stripes or rectangles.

17. The flat panel display of claim 9, wherein the crystal grains in the channel area of the switching thin film transistor include substantially parallel primary grain boundaries and secondary grain boundaries which substantially perpendicularly from the primary grain boundaries between the primary grain boundaries and have an average shorter interval than an average shorter interval of the primary grain boundaries, the primary grain boundaries are formed to be substantially stripe shapes, and a direction of current flow in the channel area is substantially perpendicular to the primary grain boundaries.

18. The flat panel display of claim 17, wherein the crystal grains in the channel area of the driving thin film transistor have at least one of shapeless grain boundaries and grain boundaries having primary grain boundaries of substantially square shapes.

19. The flat panel display of claim 9, wherein the crystal grains in the channel area of the switching thin film transistor have substantially parallel primary grain boundaries and secondary grain boundaries extending substantially perpendicularly from the primary grain boundaries between the primary grain boundaries, and the primary grain boundaries are formed as substantially square shapes.

20. The flat panel display of claim 9, wherein the channel area of the active layer of the driving thin film transistor and the channel area of the switching thin film transistor is formed using a polycrystalline silicon.

21. The flat panel display of claim 20, wherein the polycrystalline silicon is formed using a crystallization method using a laser.

22. The flat panel display of claim 9, wherein the channel area of the switching thin film transistor and the channel area of the driving thin film transistor have different current mobilities due to the crystal grain associated with each.

23. The flat panel display of claim 22, wherein the current mobility in the channel area of the switching thin film transistor is greater than the current mobility in the channel area of the driving thin film transistor due to the crystal grains associated with each.

* * * * *